US006927712B2

(12) United States Patent
Wei

(10) Patent No.: US 6,927,712 B2
(45) Date of Patent: *Aug. 9, 2005

(54) SIMPLIFIED MULTI-OUTPUT DIGITAL TO ANALOG CONVERTER (DAC) FOR A FLAT PANEL DISPLAY

(75) Inventor: Zhinan Wei, San Jose, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 56 days.

This patent is subject to a terminal disclaimer.

(21) Appl. No.: 10/896,275

(22) Filed: Jul. 21, 2004

(65) Prior Publication Data

US 2004/0257252 A1 Dec. 23, 2004

Related U.S. Application Data

(63) Continuation of application No. 10/236,211, filed on Sep. 5, 2002, now Pat. No. 6,781,532.
(60) Provisional application No. 60/317,581, filed on Sep. 5, 2001.

(51) Int. Cl.[7] .............................................. H03M 1/00
(52) U.S. Cl. ...................................... 341/122; 341/144
(58) Field of Search ................................ 341/122, 144; 345/98, 99; 315/169.1, 368.12

(56) References Cited

U.S. PATENT DOCUMENTS

| 3,619,511 | A | * | 11/1971 | Ishikawa |
| 4,455,754 | A | * | 6/1984 | Benjamin |
| 4,860,354 | A | * | 8/1989 | van Roermund |
| 5,059,872 | A | * | 10/1991 | Matsumi et al. |
| 5,170,158 | A | * | 12/1992 | Shinya |
| 5,877,719 | A | * | 3/1999 | Matsui et al. |
| 5,977,940 | A | * | 11/1999 | Akiyama et al. |
| 6,049,321 | A | * | 4/2000 | Sasaki |
| 6,108,119 | A | * | 8/2000 | Devenport et al. |
| 6,144,354 | A | * | 11/2000 | Koyama et al. |
| 6,404,135 | B1 | * | 6/2002 | Shino |
| 2003/0085859 | A1 | * | 5/2003 | Lee |

FOREIGN PATENT DOCUMENTS

CN 529299 * 10/2000

* cited by examiner

Primary Examiner—Jean Bruner Jeanglaude
(74) Attorney, Agent, or Firm—Fliesler & Meyer LLP

(57) ABSTRACT

A method and apparatus for generating reference voltages for a flat panel display system includes using a digital to analog converter (DAC) to supply multiple reference voltages to the flat panel display system, and wherein the DAC is adapted to accept digital input voltage reference from one of a plurality of registers and is adapted to provide an analog output to a demultiplexer, which includes a plurality of selectable sample and hold circuits.

20 Claims, 3 Drawing Sheets

SIMPLIFIED MULTI-OUTPUT DIGITAL TO ANALOG CONVERTER (DAC) FOR A FLAT PANEL DISPLAY

CLAIM OF PRIORITY

This application is a continuation of U.S. patent application Ser. No. 10/236,211, filed Sep. 5, 2002 (now U.S. Pat. No. 6,781,532), which claims priority under 35 U.S.C. 119(e) to U.S. Provisional Patent Application No. 60/317,581, filed on Sep. 5, 2001.

CROSS REFERENCE TO RELATED APPLICATION

This application is related to U.S. patent application Ser. No. 10/236,340, entitled ANALOG DEMULTIPLEXER, Inventor: Chor-Yin Chia, filed on Sep. 5, 2002, which is hereby incorporated herein by this reference in its entirety.

FIELD OF THE DISCLOSURE

The present invention disclosure relates to the field of reference voltage generators, in particular, reference voltage generators for use with flat panel display devices.

BACKGROUND

In conventional flat panel display systems, such as liquid crystal display (LCD) systems, the brightness of each pixel or element is controlled by a transistor. An active matrix display includes a grid of transistors (e.g., thin film transistors) arranged in rows and columns. A column line is coupled to a drain or a source associated with each transistor in each column. A row line is coupled to each gate associated with the transistors in each row. A row of transistors is activated by providing a gate control signal to the row line which turns on each transistor in the row. Each activated transistor in the row then receives an analog voltage value from its column line to cause it to emit a particular amount of light. Generally speaking, a column driver circuit provides the analog voltage to the column lines so that the appropriate amount of light is emitted by each pixel or element. The resolution of a display is related to the number of distinct brightness levels. For a high quality display, a multi-reference voltage buffer (e.g., eight or more voltages) is needed to supply voltages to the column driver.

FIG. 1 shows a simplified block diagram of a flat panel display 2, along with its driver circuitry. The driver circuitry includes a column driver 4, which obtains analog voltages from multi-reference voltage buffer 6. Although FIG. 1 shows the driver circuitry logically separate from the flat panel display 2, commercial flat panel displays typically combine the display and the driver circuitry into a single, thin package. Therefore, a major consideration in developing circuitry for such displays is the microchip die size required to implement such logic.

To achieve multi-reference voltage outputs, digital to analog converters (DAC's) can be used to generate different voltages. Capacitors can be coupled to the DAC's to temporarily buffer the voltages. Such a multi-reference voltage circuit has been conventionally implemented in several ways. One way uses a multi-DAC structure as shown in FIG. 2 wherein one DAC is used to drive a buffer for each channel. DAC circuits are very large, however. With such a multi-DAC structure, as the number of outputs increase the chip die size will become undesirably large. Another way of implementing a multi-reference voltage buffer is to use a resistor or capacitor ladder with a switching network as illustrated in FIG. 3. Because all outputs operate independently, for an N-bit converter with M outputs, $M \cdot 2^N$ switches are needed. Thus, the number of switches required can occupy an undesirably large space. What is needed is a multi-reference voltage buffer small enough to be used in flat panel display packages.

DETAILED DESCRIPTION

Figure 1:
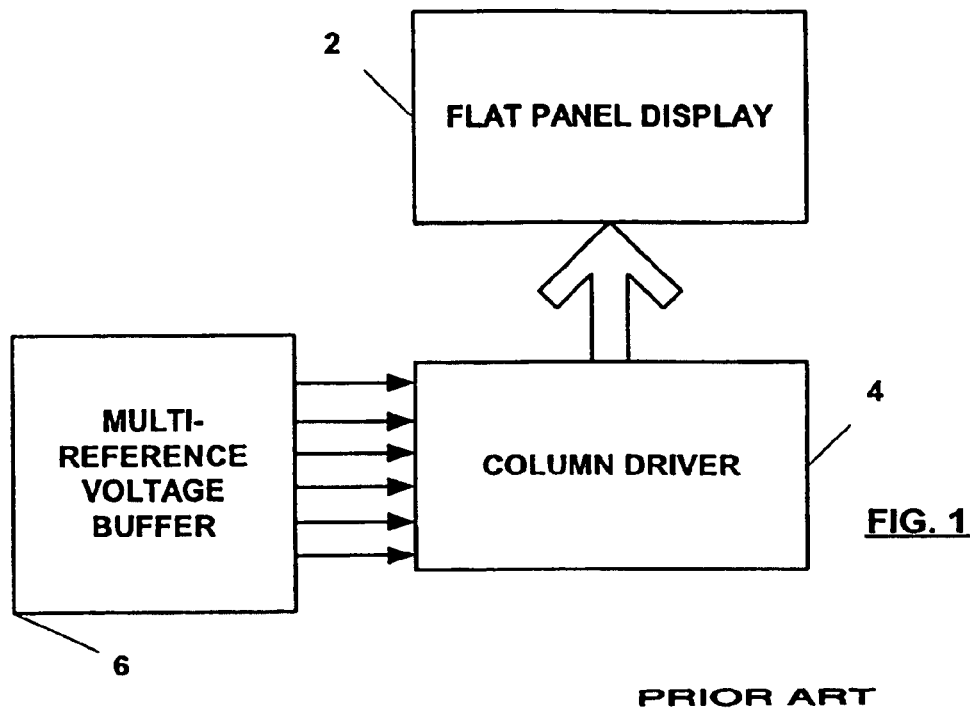
FIG. 1 is a block diagram of a generic flat panel display system.
Figure 2:
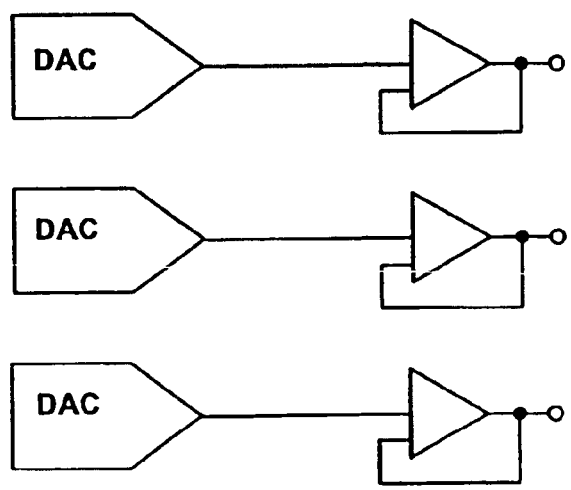
FIG. 2 is a block diagram of a prior art multi-reference voltage buffer.
Figure 3:
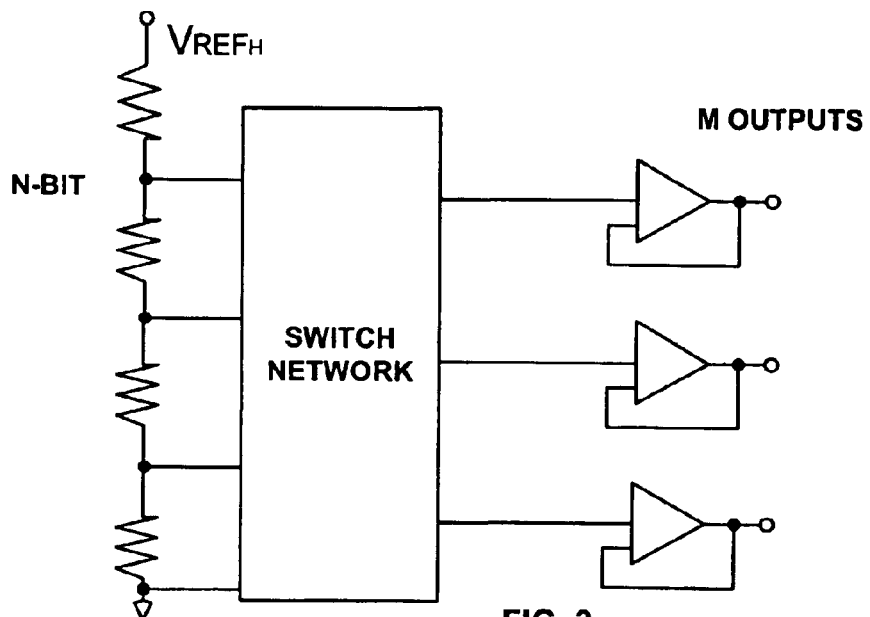
FIG. 3 is a block diagram of another prior art multi-reference voltage buffer.
Figure 4:
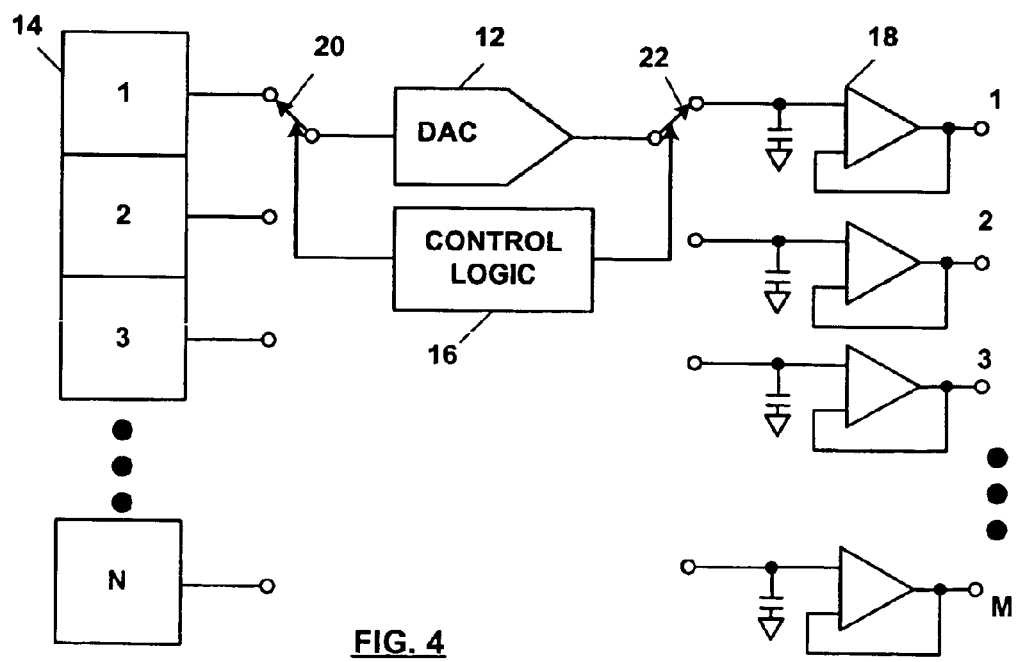
FIG. 4 is a block diagram of one embodiment of the present invention.

FIG. 4 is a block diagram of one embodiment of the present invention. In one embodiment, by way of illustration, a single DAC 12 can be used with N registers 14 and M sample and hold circuits 18 to provide M multi-reference voltage outputs. The M multi-reference outputs are used as input to a column driver (not shown) or similar apparatus for driving a flat panel display (not shown). In operation, DAC 12 obtains a digital data input from one of the DAC registers 14 and then outputs a corresponding analog voltage to one of the sample and hold circuits 18. M can be any integer. Each DAC register 14 is k bits wide. In one embodiment, k can be ten. In another embodiment, k can be any even number. Because a single DAC is used, the circuitry is small in comparison to the multi-DAC structure of FIG. 2, or in comparison to the large switch network of FIG. 3.

Control logic 16 determines which register 14 and sample and hold circuit 18 are selectively coupled to DAC 12. Control logic 16 programs switching terminals (multiplexors or similar devices) 20 and 22 to connect the appropriate register and sample and hold circuit to DAC 12. Once connected, DAC 12 accepts an integer stored in the register and converts it into an analog voltage that is output to the sample and hold circuit. Registers can be set independently. Although any register 14 can be associated with any sample and hold circuit 18, in one embodiment a given register will always be associated with the same sample and hold circuit. A sample and hold circuit (e.g., a capacitor or similar circuit element used to store a charge) can retain a charge for a limited amount of time before the charge begins to degrade. In one embodiment, the control logic 16 cycles through pairs of registers and sample and hold circuits, connecting them to DAC 12. In this way, the sample and hold circuits 18 continually maintain their charges. The control circuitry further provides a refresh to avoid voltage drift on the hold capacitor. If the refresh rate is fast enough, constant and accurate multi-buffered outputs can be obtained.

In one embodiment, each of the M sample and hold circuits 18 comprises an amplifier 24 and a capacitor 26. A first input of the amplifier 24 forms the sample and hold circuit input. A second input and output of the amplifier 24 are connected together. The capacitor 26 connects a first input of the amplifier 24 to ground.

Figure 5:
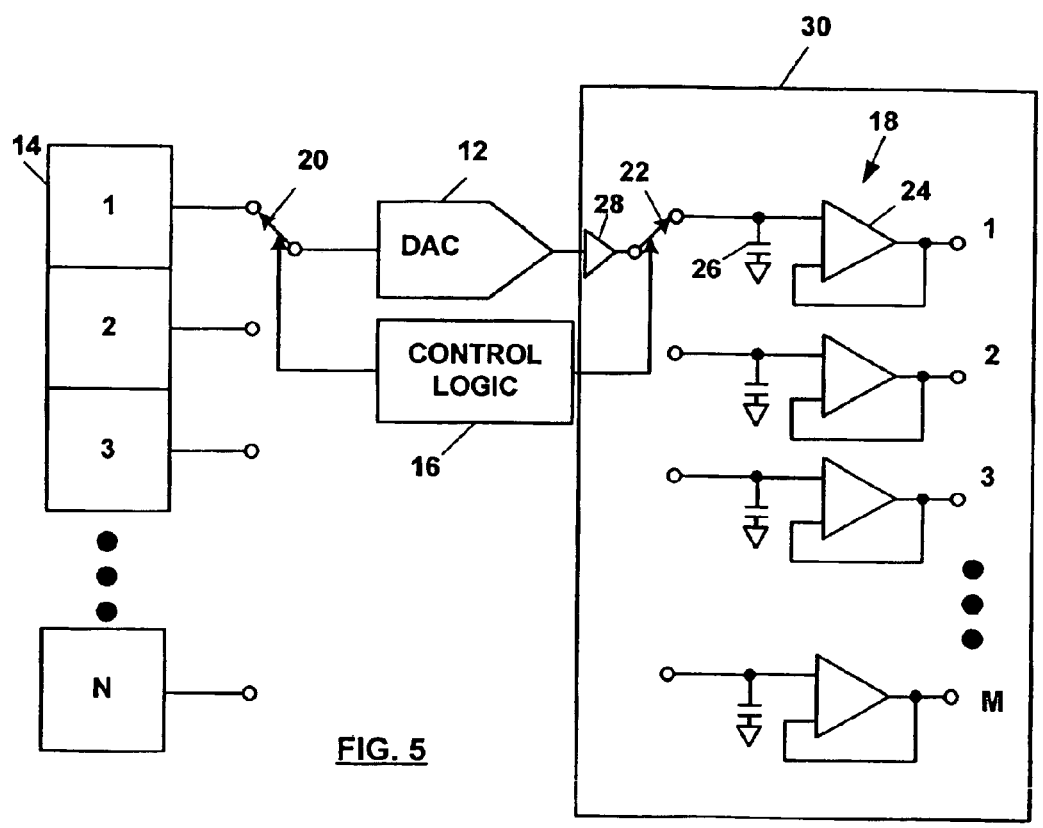
FIG. 5 is a block diagram of another embodiment of the present invention.

FIG. 5 is a block diagram of another embodiment of the present invention. This embodiment includes an input amplifier 28 to form an output demultiplexer circuit 30. Output demultiplexer circuits are described in the cross-referenced application, Ser. No. 10/236,340. In one embodiment, output demultiplexer 30 of FIG. 5 can be implemented using the circuit of FIG. 6 of the cross-referenced application, Ser. No. 10/236,340. It is to be understood that all circuitry of the present invention can be included on a single chip.

The foregoing description of the preferred embodiments of the present invention has been provided for the purposes of illustration and description. It is not intended to be exhaustive or to limit the invention to the precise forms disclosed. Many modifications and variations will be apparent to the practitioner skilled in the art. Embodiments were chosen and described in order to best describe the principles of the invention and its practical application, thereby enabling others skilled in the art to understand the invention, the various embodiments and with various modifications that are suited to the particular use contemplated. It is intended that the scope of the invention be defined by the following claims and their equivalents.

What is claimed is:

1. A reference voltage generator system, comprising:
    a digital to analog converter (DAC) having an input and an output;
    a plurality of registers, each of which is selectively coupled to the DAC input;
    a demultiplexer having an input and a plurality of outputs, the input of the demultiplexer coupled to the DAC output; and
    a controller to select which one of the plurality of registers is coupled to the DAC input, and to select which one of the plurality of demultiplexer outputs is coupled to the DAC output.

2. The system of claim 1, wherein the demultiplexer comprises:
    an amplifier having an input and an output, the amplifier input coupled to the DAC output;
    a plurality of sample and hold circuits, each of the sample and hold circuits corresponding to one of the plurality of demultiplexer outputs; and
    a switch with a common terminal coupled to the amplifier output and switching terminals each coupled to one of the sample and hold circuits, the switch to selectively couple one of the sample and hold circuits to the amplifier output.

3. The system of claim 2, further comprising:
    a further switch with a common terminal coupled to the DAC input and switching terminals each coupled to one of the registers, the further switch to selectively couple one of the registers to the DAC input.

4. The system of claim 3, wherein the controller controls the switch and the further switch.

5. The system of claim 4, wherein:
    the controller controls the switch to select which one of the plurality of sample and hold circuits is coupled to the amplifier output; and
    the controller control the further switch to select which one of the plurality of registers is coupled to the DAC input.

6. The system of claim 2, wherein the controller refreshes the sample and hold circuits.

7. The system of claim 1, wherein the plurality of demodulator outputs are coupled to a column driver.

8. The system of claim 7, wherein the column driver is coupled to a display.

9. The system of claim 8, wherein the display comprises a flat panel display.

10. The system of claim 1, wherein the registers can be updated independent from one another.

11. A reference voltage generator system, comprising:
    a digital to analog converter (DAC) having an input and an output;
    a plurality of registers, each of which is selectively coupled to the DAC input;
    an amplifier having an input and an output, the amplifier input coupled to the DAC output;
    a plurality of sample and hold circuits, each of which is selectively coupled to the amplifier output; and
    a controller to select which one of the plurality of registers is coupled to the DAC input, and to select which one of the plurality of sample and hold circuits is coupled to the amplifier output.

12. The system of claim 11, further comprising:
    a first switch with a common terminal coupled to the DAC input and switching terminals each coupled to one of the registers, the first switch to selectively couple one of the registers to the DAC input; and
    a second switch with a common terminal coupled to the amplifier output and switching terminals each coupled to one of the sample and hold circuits, the second switch to selectively couple one of the sample and hold circuits to the amplifier output.

13. The system of claim 12, wherein the controller controls the first and second switches.

14. The system of claim 13, wherein:
    the controller controls the first switch to select which one of the plurality of registers is coupled to the DAC input; and
    the controller controls the second switch to select which one of the plurality of sample and hold circuits is coupled to the amplifier output.

15. The system of claim 14, wherein the controller refreshes the sample and hold circuits.

16. The system of claim 11, wherein the plurality of sample and hold circuits are coupled to a column driver.

17. The system of claim 16, wherein the column driver is coupled to a display.

18. The system of claim 17, wherein the display comprises a flat panel display.

19. The system of claim 11, wherein the registers can be updated independent from one another.

20. For use in an environment including a plurality of registers, a digital to analog converter (DAC) having an input and an output, and a demultiplexer having an input coupled to the DAC output and a plurality of outputs coupled to a line driver, a method useful for providing reference voltages to a flat panel display that is driven by the line driver, the method comprising:
    (a) selectively coupling one of the registers to the DAC input, such that the DAC accepts a digital input from a selected one of the registers; and
    (b) controlling which one the demultiplexer outputs provides, to the line driver, an analog output indicative of the digital input accepted by the DAC from the selected register.

* * * * *